United States Patent
Onishi et al.

(10) Patent No.: US 9,185,495 B2
(45) Date of Patent: Nov. 10, 2015

(54) OSCILLATION DEVICE AND ELECTRONIC APPARATUS

(75) Inventors: Yasuharu Onishi, Kanagawa (JP); Jun Kuroda, Kanagawa (JP); Yukio Murata, Kanagawa (JP); Motoyoshi Komoda, Kanagawa (JP); Nobuhiro Kawashima, Kanagawa (JP); Yuichiro Kishinami, Kanagawa (JP); Shigeo Satou, Kanagawa (JP)

(73) Assignee: NEC CORPORATION, Tokyo (JP)

( * ) Notice: Subject to any disclaimer, the term of this patent is extended or adjusted under 35 U.S.C. 154(b) by 375 days.

(21) Appl. No.: 13/703,095

(22) PCT Filed: Jun. 28, 2011

(86) PCT No.: PCT/JP2011/003686
§ 371 (c)(1),
(2), (4) Date: Dec. 10, 2012

(87) PCT Pub. No.: WO2012/001954
PCT Pub. Date: Jan. 5, 2012

(65) Prior Publication Data
US 2013/0077443 A1 Mar. 28, 2013

(30) Foreign Application Priority Data
Jun. 30, 2010 (JP) .................... 2010-149877

(51) Int. Cl.
*H04R 17/00* (2006.01)
*B06B 1/06* (2006.01)
(Continued)

(52) U.S. Cl.
CPC ........ *H04R 17/00* (2013.01); *B06B 1/06* (2013.01); *G01S 7/521* (2013.01); *G01S 15/08* (2013.01); *H01L 41/083* (2013.01);
(Continued)

(58) Field of Classification Search
CPC ................... B06B 1/06; B41J 2/161
See application file for complete search history.

(56) References Cited

U.S. PATENT DOCUMENTS 5,343,443 A * 8/1994 Merewether .................. 367/152
5,754,205 A * 5/1998 Miyata et al. ................... 347/70
(Continued)

FOREIGN PATENT DOCUMENTS

CN 1678133 A 10/2005
CN 101336562 A 12/2008
(Continued)

OTHER PUBLICATIONS

Communication dated Nov. 4, 2014 from the State Intellectual Property Office of People's Republic of China in counterpart Application No. 201180032594.9.
(Continued)

*Primary Examiner* — Luke Ratcliffe
(74) *Attorney, Agent, or Firm* — Sughrue Mion, PLLC

(57) ABSTRACT

An oscillation device includes: a piezoelectric vibrator (110) in which electrode layers (112, 113) are formed over top and bottom surfaces of a piezoelectric layer (111); a vibrating member (120) having at least atop surface to which the piezoelectric vibrator (110) is bonded; and a resin member (130) formed continuously in a circumferential direction over at least the outer side surface of the piezoelectric vibrator (110). Therefore, since it is possible to increase the working area of the piezoelectric vibrator, it is possible to realize both an increase in the sound pressure level of the output and miniaturization of the apparatus.

15 Claims, 6 Drawing Sheets

(51) Int. Cl.
*G01S 7/521* (2006.01)
*G01S 15/08* (2006.01)
*H01L 41/083* (2006.01)
*H01L 41/09* (2006.01)

(52) U.S. Cl.
CPC ....... *H01L 41/0973* (2013.01); *H04R 2217/03* (2013.01); *H04R 2499/11* (2013.01)

(56) References Cited

U.S. PATENT DOCUMENTS

2006/0214536 A1* 9/2006 Sugahara ................. 310/311
2007/0172076 A1 7/2007 Mori et al.

FOREIGN PATENT DOCUMENTS

| | | |
|---|---|---|
| CN | 101611538 A | 12/2009 |
| JP | 63-013498 A | 1/1988 |
| JP | 3-173652 A | 7/1991 |
| JP | 03-270282 A | 12/1991 |
| JP | 2004-266643 A | 9/2004 |
| JP | 2004-312561 A | 11/2004 |
| JP | 2005-183275 A | 7/2005 |
| JP | 2007-111847 A | 5/2007 |
| JP | 2010-103977 A | 5/2010 |
| WO | 2005/076660 A1 | 8/2005 |
| WO | 2007/026736 A1 | 3/2007 |
| WO | 2007/083497 A1 | 7/2007 |

OTHER PUBLICATIONS

Communication dated Sep. 24, 2014 from the Japanese Patent Office in counterpart application No. 2012-522463.

* cited by examiner

OSCILLATION DEVICE AND ELECTRONIC APPARATUS

CROSS REFERENCE TO RELATED APPLICATIONS

This application is a National Stage of International Application No. PCT/JP2011/003686 filed Jun. 28, 2011, claiming priority based on Japanese Patent Application No. 2010-149877 filed Jun. 30, 2010, the contents of all of which are incorporated herein by reference in their entirety.

TECHNICAL FIELD

The present invention relates to an oscillation device with a piezoelectric vibrator and in particular, to an oscillation device in which a piezoelectric vibrator is provided in a vibrating member and an electronic apparatus having this oscillation device.

BACKGROUND ART

In recent years, demand for portable electronic apparatuses, such as mobile phones or notebook computers, has been growing. In such electronic apparatuses, thin mobile terminals having sound functions of a videophone or video reproduction, a hands-free phone, and the like as commercial values are under development. Among such developments, there is a growing demand for high-quality sound and reduction in the size and thickness of an electro-acoustic transducer (speaker device) that is an audio component.

In the related art, an electro-dynamic electro-acoustic transducer has been used as an electro-acoustic transducer in an electronic apparatus, such as a mobile phone. The electro-dynamic electro-acoustic transducer is configured to include a permanent magnet, a voice coil, and a vibrating film.

However, there is a limitation in making the electro-dynamic electro-acoustic transducer thin due to its operating principle and structure. On the other hand, Patent Documents 1 and 2 disclose using a piezoelectric vibrator as an electro-acoustic transducer.

Moreover, in addition to the speaker device, various oscillation devices or electronic apparatuses, such as a sound wave sensor (refer to Patent Document 3) that detects a distance to an object using sound waves oscillated from a piezoelectric vibrator, are known as other examples of the oscillation device using a piezoelectric vibrator (Patent Documents 4 to 6).

RELATED DOCUMENT

Patent Document

[Patent Document 1] WO 2007/026736
[Patent Document 2] WO 2007/083497
[Patent Document 3] JP-A-03-270282
[Patent Document 4] JP-A-63-13498
[Patent Document 5] JP-A-2004-312561
[Patent Document 6] JP-A-2007-111847

DISCLOSURE OF THE INVENTION

The oscillation device using a piezoelectric vibrator generates a vibration amplitude by the electrostrictive effect by the input of an electrical signal using the piezoelectric effect of a piezoelectric layer. In addition, the electro-dynamic electro-acoustic transducer generates a vibration by piston type reciprocating movement, while the oscillation device using a piezoelectric vibrator takes a bending type vibration mode. Accordingly, the amplitude in the oscillation device using a piezoelectric vibrator is small. For this reason, the oscillation device using a piezoelectric vibrator is advantageous over the electro-dynamic electro-acoustic transducer described above in terms of a reduction in the thickness.

However, the sound pressure level, which is one of the physical indices of the oscillation device, is determined by the amount of volume exclusion of the air by the vibrator. In other words, the sound pressure level of the oscillation device depends on the working area of the piezoelectric vibrator.

In the oscillation device in the related art, however, it is not possible to form electrode layers over the entire region of top surface and the entire region of bottom surface of the piezoelectric layer in order to prevent electrode layers formed on the top and bottom surfaces of the piezoelectric layer from being electrically connected to each other by migration and the like. Accordingly, no electrode layer is formed in the outer periphery of the top and bottom surfaces of the piezoelectric layer.

For this reason, in the case of the oscillation device using a piezoelectric vibrator, the amplitude and the amount of volume exclusion are likely to be small compared with those in the electro-dynamic electro-acoustic transducer, and it has been difficult to obtain the sufficient sound pressure level of an output when the oscillation device is made to be small.

The present invention has been made in view of the above problems, and it is an object of the present invention to provide an oscillation device capable of realizing both an increase in the sound pressure level of an output and miniaturization of an apparatus and an electronic apparatus using this oscillation device.

An oscillation device of the present invention includes: a piezoelectric vibrator in which electrode layers are formed over top and bottom surfaces of a piezoelectric layer; a vibrating member having at least a top surface to which the piezoelectric vibrator is bonded; and a resin member formed continuously in a circumferential direction over at least an outer side surface of the piezoelectric vibrator.

A first electronic apparatus of the present invention includes the oscillation device of the present invention and an oscillation driving unit that makes the oscillation device output audible sound waves.

A second electronic apparatus of the present invention includes the oscillation device of the present invention, an ultrasonic detection unit that detects the ultrasonic waves oscillated from the oscillation device and reflected by an object to be measured, and a distance measuring unit that calculates a distance to the object to be measured on the basis of the detected ultrasonic waves.

In the oscillation device of the present invention, the outer side surface of the piezoelectric vibrator is sealed with the resin member. Accordingly, it is possible to prevent a short circuit between the electrode layers on the top and bottom surfaces of the piezoelectric vibrator. For this reason, it is possible to form electrode layers over the entire region of top surface and the entire region of bottom surface of the piezoelectric layer. Therefore, since it is possible to increase the working area of the piezoelectric vibrator, it is possible to realize both an increase in the sound pressure level of the output and miniaturization of the apparatus.

BRIEF DESCRIPTION OF THE DRAWINGS

The above-described object and other objects, features, and advantages will become more apparent by preferred embodiments described below and the following accompanying drawings.

DESCRIPTION OF EMBODIMENTS

Figure 1:
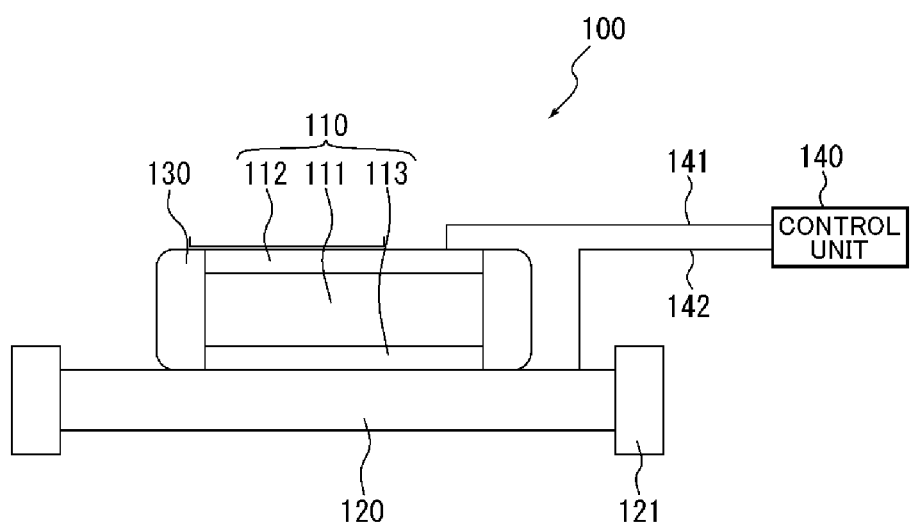
FIG. 1 is a schematic longitudinal sectional front view showing the structure of an electro-acoustic transducer that is an oscillation device of a first embodiment of the present invention.

A first embodiment of the present invention will be described below with reference to FIGS. 1 and 2. As shown in the drawings, an electro-acoustic transducer 100 that is an oscillation device of the present embodiment includes: a piezoelectric vibrator 110 in which electrode layers 112 and 113 are respectively formed on top and bottom surfaces of a piezoelectric ceramic 111 that is a piezoelectric layer; an elastic diaphragm 120 that is a vibrating member having at least a top surface to which the piezoelectric vibrator 110 is bonded; and a resin member 130 that is formed continuously in a circumferential direction in whole circumference on at least the outer side surface of the piezoelectric vibrator 110.

Figure 2:
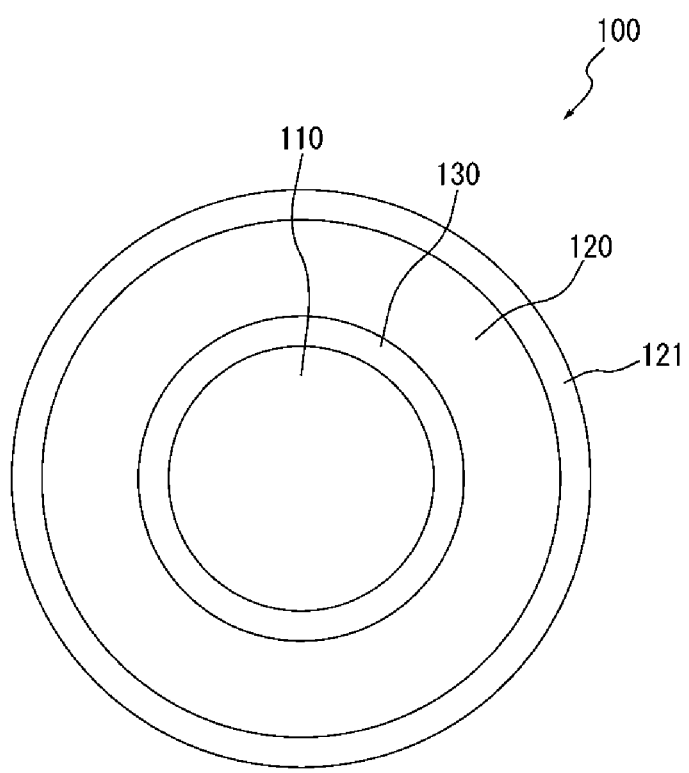
FIG. 2 is a schematic plan view showing the structure of an electro-acoustic transducer.

More specifically, in the electro-acoustic transducer 100 of the present embodiment, the elastic diaphragm 120 is formed in a circular planar shape as shown in FIG. 2, and the outer peripheral portion is supported by an annular frame 121 as shown in FIGS. 1 and 2.

The piezoelectric vibrator 110 is also formed in a circular planar shape, and is bonded to the central surface of the circular elastic diaphragm 120. The resin member 130 is also in close contact with the top surface of the elastic diaphragm 120 in at least a portion connected to the outer side surface of the piezoelectric vibrator 110.

The resin member 130 is formed of epoxy resin whose softening point is higher than the polarization temperature of the piezoelectric layer 111, for example, equal to or higher than 80° C. This resin member 130 is more flexible than the piezoelectric vibrator 110 and the elastic diaphragm 120.

In addition, "A is more flexible than B" means that the modulus of elasticity of A is lower than that of B or the like, for example. This is the same hereinbelow in this specification.

In addition, the internal loss of the resin member 130 is larger than those of the piezoelectric vibrator 110 and the elastic diaphragm 120. In addition, the resin member 130 has a moisture-proof property, and its conductivity is lower than those of the piezoelectric ceramic 111 and the electrode layers 112 and 113.

As such a resin member 130, a material whose Young's modulus is equal to or less than 500 GPa is preferable. The electrical conductivity of the resin member 130 is about 1/100 of that of each of the electrode layers 112 and 113.

In addition, in the electro-acoustic transducer 100 of the present embodiment, a control unit 140 that is an oscillation driving unit is connected to the electrode layers 112 and 113 of the piezoelectric vibrator 110. An electric field which oscillates the piezoelectric vibrator 110 in an audible range or an ultrasonic range is applied from the control unit 140.

In addition, the electrode layer 112 at the top surface is directly connected to the control unit 140 through a lead wire 141, for example, and the electrode layer 113 at the bottom surface is connected to the control unit 140 through the metal elastic diaphragm 120 and a lead wire 142.

In addition, lead zirconate titanate (PZT) or the like is used as the piezoelectric ceramic 111. However, there is no particular limitation. Although not particularly limited, it is preferable that the thickness of the piezoelectric ceramic 111 be equal to or greater than 10 µm and equal to or less than 500 µm.

For example, when a thin film with a thickness less than 10 µm is used as a ceramic material which is a brittle material, chipping, breakage, or the like occurs due to the weakness of the mechanical strength during handling. This makes handling difficult.

In addition, when the piezoelectric ceramic 111 with a thickness exceeding 500 µm is used, the conversion efficiency when converting electrical energy into mechanical energy is significantly reduced. Accordingly, it is not possible to obtain the satisfactory performance as the electro-acoustic transducer 100.

Generally, in the piezoelectric ceramic 111 that generates the electrostrictive effect by the input of an electrical signal, the conversion efficiency depends on the electric field strength. Since this electric field strength is expressed as "thickness in a polarization direction"/"input voltage", there is a problem in that an increase in the thickness necessarily causes a reduction in conversion efficiency.

In the piezoelectric vibrator 110 of the present embodiment, the electrode layers 112 and 113 are formed at the top and bottom surfaces in order to generate an electric field. Materials of the electrode layers 112 and 113 are not particularly limited as long as they are materials having electrical conductivity, but it is preferable to use silver or silver/palladium. Silver is used as a general-purpose electrode layer with low resistance, and there is an advantage in the manufacturing process, cost, and the like.

In addition, since silver/palladium is a low resistance material having excellent oxidation resistance, there is an advantage from the viewpoint of reliability. In addition, the thickness of each of the electrode layers 112 and 113 is not particularly limited, but it is preferable that the thickness be equal to or greater than 1 µm and equal to or less than 50 µm.

For example, if the film thickness is less than 1 µm, the electrode layers cannot be formed uniformly since the film thickness is small. Accordingly, the conversion efficiency may be lowered. In addition, as a technique for forming the thin film electrode layers 112 and 113, there is also a paste-state application method.

However, in a polycrystal such as the piezoelectric ceramic 111, the wetting state at the time of coating is poor since the surface state is a satin-finished surface. Accordingly, there is a problem in that a uniform electrode layer cannot be formed without a certain thickness.

On the other hand, when the film thickness of each of the electrode layers 112 and 113 exceeds 100 µm, there is no particular problem in manufacturing, but the electrode layers 112 and 113 become constraint surfaces for the piezoelectric ceramic 111. This causes a problem in that the energy conversion efficiency is lowered.

In the piezoelectric vibrator 110 of the electro-acoustic transducer 100 of the present embodiment, the main surface on one side thereof is constrained by the elastic diaphragm 120. The elastic diaphragm 120 propagates outside the vibration generated from the piezoelectric vibrator 110.

In addition, at the same time, the elastic diaphragm 120 has a function of adjusting the fundamental resonance frequency of the piezoelectric vibrator 110. As shown in the following formula, the fundamental resonance frequency f of the mechanical electro-acoustic transducer 100 depends on the load weight and compliance.

$$f=1/(2\pi L\sqrt{(mC)})$$ [formula 1]

In addition, "m" is a mass, and "C" is compliance.

In other words, since the compliance is the mechanical rigidity of the electro-acoustic transducer 100, this means that the fundamental resonance frequency can be controlled by controlling the rigidity of the piezoelectric vibrator 110.

For example, it is possible to shift the fundamental resonance frequency to the low frequency region by selecting a material with a low modulus of elasticity or reducing the thickness of the elastic diaphragm 120. On the other hand, it is possible to shift the fundamental resonance frequency to the high frequency region by selecting a material with a high modulus of elasticity or increasing the thickness of the elastic diaphragm 120.

In the related art, since the fundamental resonance frequency is controlled by the shape or material of the piezoelectric vibrator 110, there has been a problem in design constraints, cost, or reliability. However, by changing the elastic diaphragm 120, which is a component, as in the present invention, adjustment to a desired fundamental resonance frequency can be easily performed. Therefore, the industrial value is great.

In addition, in the electro-acoustic transducer 100 of the present embodiment, the outer side surface of the piezoelectric vibrator 110 is constrained by the resin member 130. For this reason, the mechanical quality factor Q of a piezoelectric vibrator can be reduced using a high internal loss of the resin member 130.

In the known electro-acoustic transducer, no resin member is present on the outer side surface of the piezoelectric vibrator. Accordingly, there has been a tendency that Q of the characteristics of a material is high. In the electro-acoustic transducer 100 of the present embodiment, Q can be reduced since mechanical damping can be applied to the piezoelectric vibrator 110 by the resin member 130. As a result, the amplitude-frequency characteristic becomes flat, and the application range as the electro-acoustic transducer 100 is expanded.

In addition, materials of the elastic diaphragm 120 are not particularly limited as long as they are materials having a high modulus of elasticity for the ceramic which is a brittle material, such as metal or resin. However, from the viewpoint of workability, cost, or the like, general-purpose materials, such as phosphor bronze and stainless steel, are used.

In addition, it is preferable that the thickness of the elastic diaphragm 120 be equal to or greater than 5 μm and equal to or less than 1000 μm. When the thickness is less than 5 μm, the mechanical strength is low. Accordingly, there is a problem in that a function as a constraint member is damaged or errors of the mechanical vibration characteristics of the piezoelectric vibrators 110 occur between manufacturing lots due to a reduction in the machining accuracy.

In addition, when the thickness exceeds 1000 μm, the constraint to the piezoelectric vibrator 110 due to an increase in the rigidity is strengthened. Accordingly, there is a problem in that attenuation of the amount of vibration displacement is caused. In addition, for the elastic diaphragm 120 of the present embodiment, it is preferable that the Young's modulus, which is an indicator showing the rigidity of a material, be equal to or greater than 1 GPa and equal to or less than 500 GPa. As described above, when the rigidity of the elastic diaphragm 120 is too low or too high, there is a problem in that the characteristics or the reliability as a mechanical vibrator is damaged.

Here, a method of manufacturing the electro-acoustic transducer 100 of the present embodiment will be described below. First, for the piezoelectric vibrator 110, the piezoelectric ceramic 111 with an external diameter of ϕ3 mm and a thickness of 200 μm is formed, and the electrode layers 112 and 113 each of which has a thickness of 8 μm are respectively formed on both surfaces of the piezoelectric ceramic 111.

Lead zirconate titanate based ceramic is used as the piezoelectric ceramic 111, and silver/palladium alloy (ratio by weight 70%:30%) is used as the electrode layers 112 and 113. Manufacturing of the piezoelectric ceramic 111 is performed using a green sheet method. Baking is performed at 1100° C. for 2 hours in the air and then polarization processing is performed on the piezoelectric ceramic 111. An epoxy adhesive is used for bonding between the piezoelectric vibrator 110 and the elastic diaphragm 120.

In addition, in order to obtain the piezoelectric vibrator 110 with a high reliability, an interface between the outer side surface of the piezoelectric vibrator 110 and the elastic diaphragm 120 is protected by the resin member 130 having low electrical conductivity. After bonding the piezoelectric vibrator 110 to the surface of the elastic diaphragm 120, the resin member 130 is formed so as to seal the outer side surface of the piezoelectric vibrator 110.

In the electro-acoustic transducer 100 of the present embodiment, the interface between the elastic diaphragm 120 and the piezoelectric layer on which the stress is concentrated can be protected by the resin member 130. Therefore, since chipping, cracking, or mechanical breakage can be prevented, the reliability is improved.

In addition, a short circuit between the electrode layers 112 and 113 on the top and bottom surfaces of the piezoelectric ceramic 111 due to migration or the like can be prevented by protection using the resin member 130 with low conductivity.

For this reason, the electrode layers 112 and 113 can be formed over the entire region of top surface and the entire region of bottom surface of the piezoelectric ceramic 111, respectively, without worrying about the short circuit between the electrode layers 112 and 113. Therefore, since the entire piezoelectric ceramic 111 can be oscillated, it is possible to realize both an increase in the sound pressure level of the output and miniaturization of the apparatus.

In addition, by using the resin member 130 with a large internal loss, it is possible to reduce the mechanical quality factor Qm. That is, it is possible to apply mechanical damping to the interface between the piezoelectric vibrator 110 and the elastic diaphragm 120 on which the stress is concentrated.

In addition, in this configuration, ultrasonic waves are oscillated in order to realize the privacy protectable sound reproduction. Here, the principle of the parametric speaker that demodulates modulated ultrasonic waves to an audible sound is used. The piezoelectric vibrator 110 oscillates ultrasonic waves with a frequency of 20 kHz or higher.

Here, the sound reproduction is performed on the basis of the principle in which ultrasonic waves after AM (Amplitude Modulation) modulation, DSB (Double Sideband) modulation, SSB (Single-Sideband modulation) modulation, or FM (Frequency Modulation) modulation are emitted into the air and an audible sound appears due to non-linear characteristics when the ultrasonic waves propagate in the air.

As non-linear characteristics, a phenomenon may be mentioned in which transition from laminar flow to turbulent flow occurs as the Reynolds number expressed by the ratio of the inertial effect and the viscosity effect of the flow increases.

That is, since there are fine disturbances in sound waves in the fluid, the sound waves propagate in a non-linear shape.

However, although the amplitude of the sound waves in a low frequency band is non-linear, since the amplitude difference is very small, the sound waves are generally treated as a phenomenon of the linear theory. In contrast, in the case of ultrasonic waves, non-linearity can be easily observed. Accordingly, when the ultrasonic waves are emitted into the air, harmonics due to the non-linearity are noticeably generated.

In summary, this is a principle in which, since the sound waves are in a dense state in which molecular groups are densely mixed in the air and a sparse state in which molecular groups are sparsely mixed in the air, and when it takes more time to restore air molecules than to compress them, the air that cannot be restored after compression collides with the air molecules propagating continuously to generate impact waves and this generates an audible sound.

Then, the principle of the operation of the piezoelectric vibrator 110 will be described. The piezoelectric ceramic 111 is formed of a piezoelectric plate having two main surfaces as described above, and the electrode layers 112 and 113 are formed on the main surfaces of the piezoelectric ceramic 111.

The polarization direction of the piezoelectric ceramic 111 is not particularly limited. In the electro-acoustic transducer of the present embodiment, the polarization direction is an upward direction in the vertical direction (thickness direction of the piezoelectric vibrator 110). The piezoelectric vibrator 110 configured in this manner performs expansion and contraction movement in a radial direction (radially spreading movement), such as simultaneous expansion or contraction of both the main surfaces, when an AC voltage is applied to the electrode layers 112 and 113 to give an alternating electric field.

In other words, the piezoelectric vibrator 110 performs movement such that a first deformation mode, in which the main surface expands, and a second deformation mode, in which the main surface contracts, are repeated. By repeating such movement, the elastic diaphragm 120 generates a vertical vibration due to the inertial effect and the restoration effect using the elastic effect, thereby generating ultrasonic waves.

As described above, due to the operation of the piezoelectric vibrator 110, a stress concentrates on a junction portion between the outer peripheral portion and the elastic diaphragm 120. In the electro-acoustic transducer 100 of the present embodiment, however, the resin member 130 is bonded to the outer surface of the elastic diaphragm 120 and the piezoelectric vibrator 110. This resin member 130 serves to prevent mechanical breakage at the interface on which the stress is concentrated.

At the boundary between materials with different rigidities, a stress concentrates at the time of transmission of driving force. Therefore, problems, such as breakage, occur when the amplitude is large. In this configuration, since the resin member 130 with an elastic force is formed, it is possible to reduce the stress concentration.

In addition, since the softening point of the resin member 130 is higher than the polarization temperature of the piezoelectric layer 111, there is no concern that the resin member 130 will be melted even if the piezoelectric layer 111 is heated for polarization. In addition, since the resin member 130 is formed of epoxy resin, the resin member 130 can also be used as an adhesive to bond the piezoelectric vibrator 110 to the elastic diaphragm 120.

In addition, in the configuration of the present invention, the piezoelectric vibrator 110 oscillates ultrasonic waves with a frequency of 20 kHz or higher. Sound reproduction is performed on the basis of the principle of a so-called parametric speaker in which FM or AM modulated ultrasonic waves are oscillated and an audible sound is reproduced by demodulating modulated waves using the non-linear state (dense and sparse states) of the air. Since this propagates sound waves using high directivity which is a characteristic of ultrasonic waves, it is possible to realize a privacy sound source which is audible to only a user.

As described above, the electro-acoustic transducer 100 of the present embodiment is small and can reproduce the large volume of sound. In addition, since the ultrasonic waves are used, the directivity is narrow. Therefore, the industrial value is great in terms of user's privacy protection and the like.

That is, in the electro-acoustic transducer 100 of the present embodiment, the linearity of the sound waves is high compared with an electro-acoustic transducer in the related art. Therefore, it is possible to selectively propagate sound waves to the desired user location. In summary, the electro-acoustic transducer 100 of the present embodiment may also be used as a sound source of an electronic apparatus (for example, a mobile phone, a notebook personal computer, or a small game machine). In addition, it is possible to prevent an increase in the size of the electro-acoustic transducer 100, and acoustic characteristics are improved. Accordingly, the electro-acoustic transducer 100 may also be appropriately used for a portable electronic apparatus.

In addition, the present invention is not limited to the present embodiment and various modifications are allowed within the range without departing from the subject matter. For example, in the present embodiment, using the piezoelectric ceramic 111, such as lead zirconate titanate (PZT), as a piezoelectric element of the piezoelectric vibrator 110 has been illustrated.

However, materials of the piezoelectric element are not particularly limited to both inorganic materials and organic materials as long as they are materials having a piezoelectric effect. Materials with high electromechanical conversion efficiency, for example, materials, such as barium titanate ($BaTiO_3$), may be used.

Figure 3:
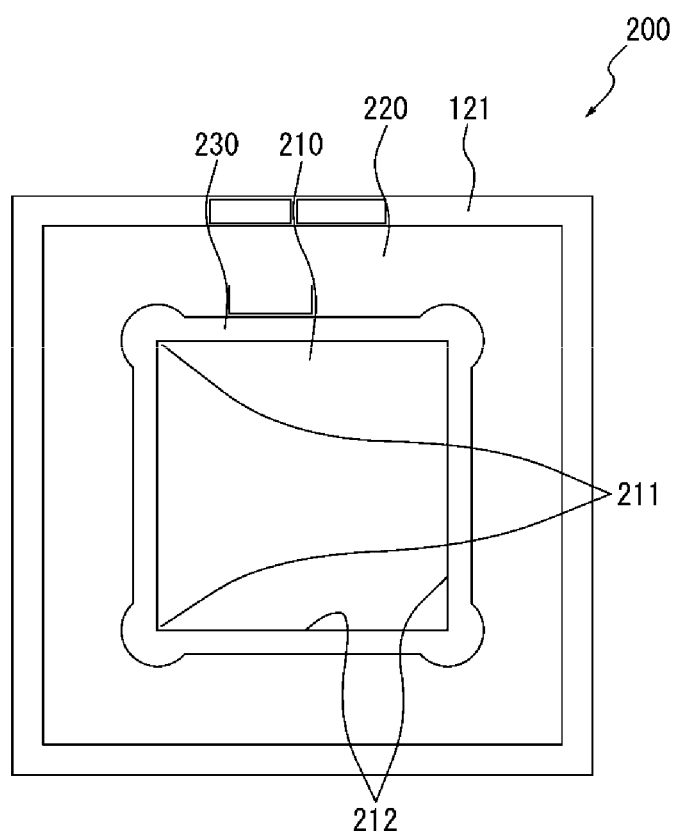
FIG. 3 is a plan view showing the structure of an electro-acoustic transducer of a first modification.

In addition, in the above embodiment, it has been illustrated that the piezoelectric vibrator 110 and the elastic diaphragm 120 are formed in a concentric circular planar shape. However, as an electro-acoustic transducer 200 that is an oscillation device illustrated in FIG. 3, a piezoelectric vibrator 210 or an elastic diaphragm 220 that is a vibrating member may be formed in a rectangular shape, such as a square shape.

In addition, for such a piezoelectric vibrator 210 formed in a rectangular planar shape which has four corners 211 and four sides 212, a resin member 230 is preferably formed in a planar shape that is thicker at the position of the corner 211 than at the position of the side 212 of the piezoelectric vibrator 210.

This is to bond the corner 211 to the elastic diaphragm 220 firmly by the resin member 230 since the oscillation stress is concentrated on the corner 211 in the piezoelectric vibrator 210 with the planar shape described above.

Figure 4:
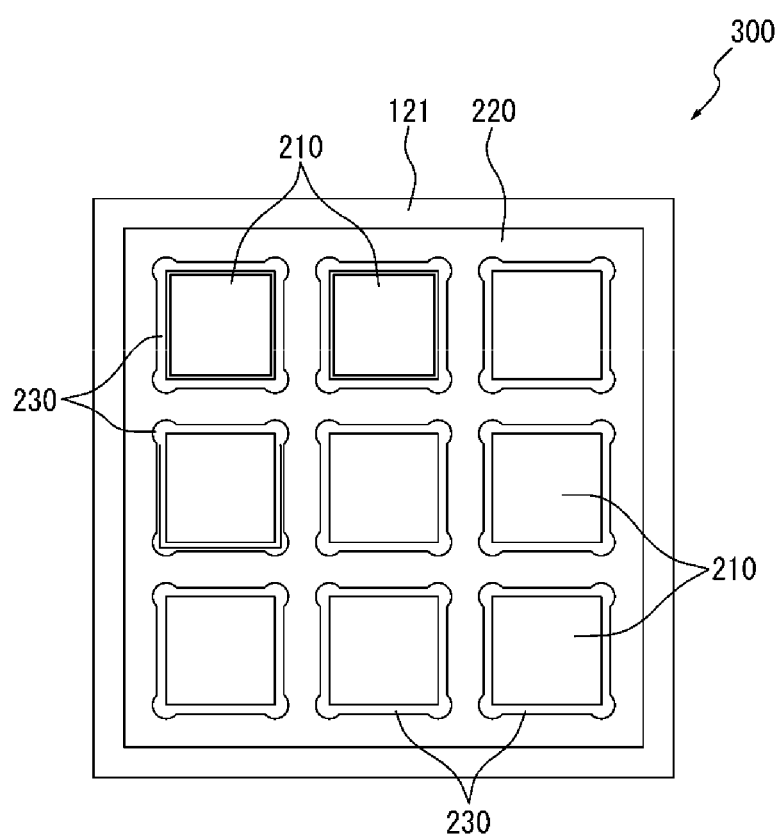
FIG. 4 is a plan view showing the structure of an electro-acoustic transducer of another modification.

In addition, in the embodiment and the first modification described above, it has been illustrated that one piezoelectric vibrator 110 or 210 is mounted in one elastic diaphragm 120 or 220. However, as an electro-acoustic transducer 300 illustrated as an oscillation device in FIG. 4, a plurality of piezoelectric vibrators 210 may be mounted in one elastic diaphragm 220 so as to be arrayed in a matrix.

Figure 5:
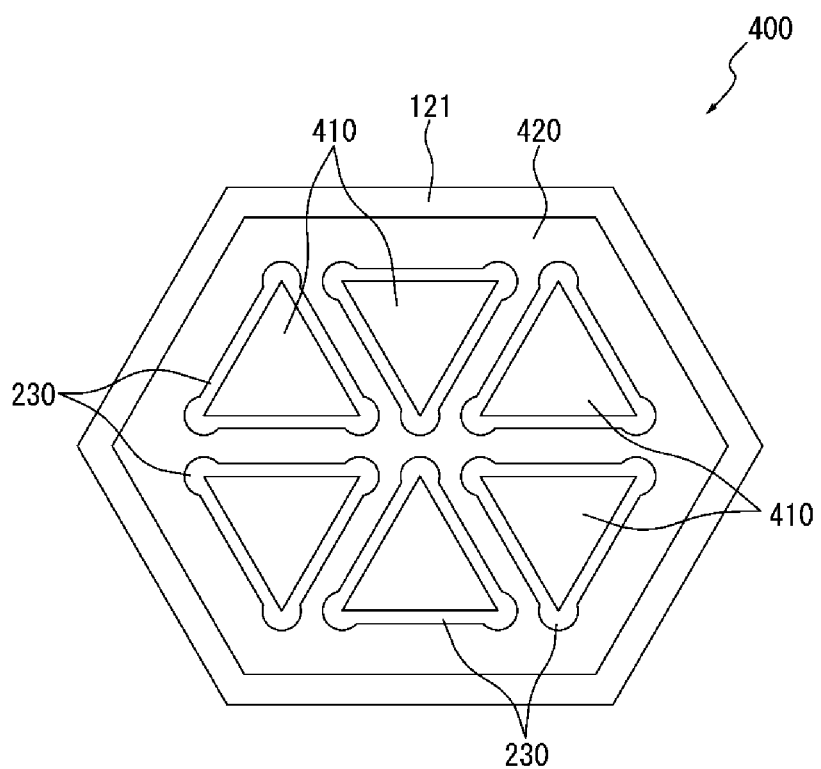
FIG. 5 is a plan view showing the structure of an electro-acoustic transducer of still another modification.

In addition, as an electro-acoustic transducer 400 illustrated as an oscillation device in FIG. 5, triangular piezoelectric vibrators 410 may be alternately arrayed upside down with respect to each other in the drawing, for example, in two rows in a hexagonal vibrating member 420. In addition, hexagonal piezoelectric vibrators may be arrayed in a honeycomb shape (not shown in the drawings).

In addition, in the embodiment described above, it has been illustrated that the piezoelectric vibrator 110 is formed of one-layer piezoelectric ceramic 111 and the electrode layers 112 and 113 on both surfaces thereof. However, such a piezoelectric vibrator may have a laminated structure in which a plurality of piezoelectric ceramics and a plurality of electrode layers are alternately formed.

In addition, in the embodiment described above, it has been illustrated that the resin member 130 is formed of epoxy resin. However, Polyethylene Terephthalate (PET), urethane, polycarbonate, polyethylene, and the like may also be used as such a resin member 130.

Figure 6:
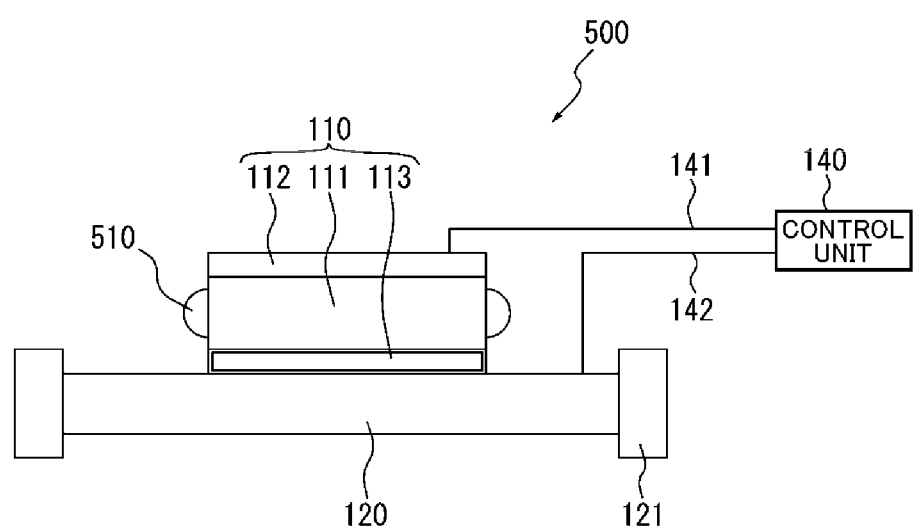
FIG. 6 is a schematic longitudinal sectional front view showing the structure of an electro-acoustic transducer of still another modification.

In addition, in the embodiment described above, it has been illustrated that the outer side surface of the piezoelectric vibrator 110 is evenly formed and the resin member 130 is formed over the entire region of the outer side surface. However, it is sufficient that such a resin member 130 can prevent at least a short circuit between the electrode members 112 and 113. Therefore, for example, as an electro-acoustic transducer 500 illustrated as an oscillation device in FIG. 6, the thickness of the resin member 130 in the vertical direction may be small if the resin member 130 is formed continuously in a circumferential direction in whole circumference on the outer side surface of the piezoelectric ceramic 111 of the piezoelectric vibrator 110.

In addition, in the embodiment described above, a mobile phone that outputs a sound using the electro-acoustic transducer 100 or the like has been assumed as an electronic apparatus. However, a sonar (not shown in the drawings) including the electro-acoustic transducer 100 or the like that is an oscillation device, an ultrasonic detection unit that detects ultrasonic waves oscillated from the electro-acoustic transducer 100 or the like and reflected by an object to be measured, and a distance measuring unit that calculates a distance to the object on the basis of the detected ultrasonic waves to be measured may also be implemented as an electronic apparatus.

In addition, it is a matter of course that the plurality of embodiments and the plurality of modifications described above may be combined within the range where the contents do not conflict with each other. In addition, although the structure and the like of each unit were specifically described in the above embodiments, the structure and the like may be variously changed within the range where the invention of this application is satisfied.

This application claims priority from Japanese Patent Application No. 2010-149877 filed on Jun. 30, 2010, the entire content of which are incorporated herein.

The invention claimed is:

1. An oscillation device comprising:
    a piezoelectric vibrator in which electrode layers are formed over top and bottom surfaces of a piezoelectric layer;
    a vibrating member having at least a top surface to which the piezoelectric vibrator is bonded; and
    a resin member formed continuously in a circumferential direction over at least an outer side surface of the piezoelectric vibrator,
    wherein the piezoelectric vibrator is formed in a polygonal planar shape having a plurality of corners and a plurality of sides, and
    the resin member is formed in a planar shape that is thicker at a position of the corner than at a position of the side of the piezoelectric vibrator.

2. The oscillation device according to claim 1, wherein the resin member is also in close contact with the top surface of the vibrating member in at least a portion connected to the outer side surface of the piezoelectric vibrator.

3. The oscillation device according to claim 1, wherein a softening point of the resin member is higher than a polarization temperature of the piezoelectric layer.

4. The oscillation device according to claim 3, wherein the softening point of the resin member is equal to or higher than 80° C.

5. The oscillation device according to claim 1, wherein the piezoelectric vibrator is formed in a rectangular planar shape having four corners and four sides.

6. The oscillation device according to claim 1,
    wherein the resin member is more flexible than the piezoelectric vibrator and the vibrating member.

7. The oscillation device according to claim 1,
    wherein an internal loss of the resin member is larger than those of the piezoelectric vibrator and the vibrating member.

8. The oscillation device according to claim 1,
    wherein the resin member has a moisture-proof property.

9. The oscillation device according to claim 1, wherein conductivity of the resin member is lower than that of the piezoelectric layer and the electrode layers.

10. The oscillation device according to claim 1,
    wherein the piezoelectric vibrator has a laminated structure in which a plurality of piezoelectric ceramics, which are the piezoelectric layers, and the plurality of electrode layers are alternately formed.

11. The oscillation device according to claim 1,
    wherein the piezoelectric layer is formed of piezoelectric ceramic.

12. The oscillation device according to claim 1, wherein a frequency of an ultrasonic wave at which the piezoelectric vibrator oscillates exceeds 20 kHz.

13. The oscillation device according to claim 1,
    wherein the piezoelectric vibrator oscillates an ultrasonic modulation wave of an audible wave.

14. An electronic apparatus comprising:
    the oscillation device according to claim 1; and
    an oscillation driving unit that makes the oscillation device output audible sound waves.

15. An electronic apparatus comprising:
    the oscillation device according to claim 1;
    an ultrasonic detection unit that detects the ultrasonic waves oscillated from the oscillation device and reflected by an object to be measured; and
    a distance measuring unit that calculates a distance to the object to be measured on the basis of the detected ultrasonic waves.

* * * * *